(12) United States Patent
Lee et al.

(10) Patent No.: US 8,418,041 B2
(45) Date of Patent: Apr. 9, 2013

(54) MPE-FEC RS DECODER AND DECODING METHOD THEREOF

(75) Inventors: In Ki Lee, Busan (KR); Dae Ig Chang, Daejeon (KR); Ho Jin Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 797 days.

(21) Appl. No.: 12/629,343

(22) Filed: Dec. 2, 2009

(65) Prior Publication Data

US 2010/0138726 A1 Jun. 3, 2010

(30) Foreign Application Priority Data

Dec. 3, 2008 (KR) .................. 10-2008-0122059
Nov. 23, 2009 (KR) .................. 10-2009-0113373

(51) Int. Cl.
*H03M 13/00* (2006.01)
(52) U.S. Cl. ........... 714/784; 714/785
(58) Field of Classification Search .......... 714/784, 714/785
See application file for complete search history.

(56) References Cited

U.S. PATENT DOCUMENTS

| | | | |
|---|---|---|---|
| 5,373,511 A | 12/1994 | Veksler | |
| 5,715,262 A * | 2/1998 | Gupta | 714/784 |
| 6,009,552 A | 12/1999 | Ariel et al. | |
| 6,453,441 B1 | 9/2002 | Daoudi et al. | |
| 7,278,086 B2 * | 10/2007 | Banks et al. | 714/784 |
| 8,095,856 B2 * | 1/2012 | Wang | 714/784 |
| 2003/0009723 A1 | 1/2003 | Chien | |
| 2003/0229841 A1 | 12/2003 | Kravtchenko | |
| 2005/0273484 A1 * | 12/2005 | Shieh | 708/492 |
| 2006/0174181 A1 * | 8/2006 | Banks et al. | 714/784 |
| 2007/0240027 A1 | 10/2007 | Vesma et al. | |
| 2010/0031127 A1 * | 2/2010 | Panteleev et al. | 714/784 |

FOREIGN PATENT DOCUMENTS

| | | |
|---|---|---|
| EP | 1 370 003 A1 | 12/2003 |
| FR | 2 765 749 A1 | 1/1999 |
| FR | 2776113 A1 | 9/1999 |
| GB | 2 391 769 A | 2/2004 |
| KR | 1020070044405 A | 4/2007 |
| KR | 2007-0084983 A | 8/2007 |
| WO | 03/096546 A2 | 11/2003 |

OTHER PUBLICATIONS

Blahut, R. E; "Algebraic Codes for Data Transmission", Jan. 1, 2003, Cambridge University Press, Cambridge, UK, XP002569764; ISBN: 0521553741; vol. 1, pp. 193-205 the whole document.
T.K. Truong, et al; "A Simplified Procedure for Correcting Both Errors and Erasures of Reed-Solomon Code Using Euclidean Algorithm", IEE Proceedings, vol. 135, No. 6, Nov. 1, 1988, pp. 318-324, XP002569765 [retrieved on Feb. 17, 2010] the whole document.
European Search Report: EP 09 17 7729.

* cited by examiner

*Primary Examiner* — Charles Ehne
(74) *Attorney, Agent, or Firm* — Ladas & Parry LLP

(57) ABSTRACT

A decoding method of an MPE-FEC (MultiProtocol Encapsulation-Forward Error Correction) RS (Reed-Solomon) decoder, includes: substituting a value corresponding to an erasure error position with 0 in a reception signal; calculating a syndrome by using the reception signal; calculating an erasure position polynomial by using erasure information; calculating a modified syndrome by using the syndrome and the erasure position polynomial; calculating an erasure error size polynomial by using the modified syndrome; calculating an error position by using the erasure position polynomial; calculating an error size by using a modified Forney's algorithm; and correcting an error through the error position and the error size.

7 Claims, 6 Drawing Sheets

MPE-FEC RS DECODER AND DECODING METHOD THEREOF

CROSS-REFERENCE TO RELATED APPLICATIONS

This application claims the priorities of Korean Patent Application Nos. 10-2008-0122059 filed on Dec. 3, 2008, and 10-2009-0113373 filed on Nov. 23, 2009 in the Korean Intellectual Property Office, the disclosures of which are incorporated herein by reference.

BACKGROUND OF THE INVENTION

1. Field of the Invention

The present invention relates to an MPE-FEC (MultiProtocol Encapsulation-Forward Error Correction) RS (Reed-Solomon) decoder and a decoding method thereof and, more particularly, to a technique that reduces the calculation of an error position polynomial of an RS decoder in consideration of hardware complexity and a data processing rate of a reception terminal in case of applying an MPE-FEC scheme to a DVB-S2 standard system.

2. Description of the Related Art

DVB-S2, a broadband satellite communication broadcast convergence service standard, suitable for a Ka band, secures an even larger transmission capacity than a DVB-S, improves service availability through an improvement of a link margin, and supports a bi-directional supplementary broadcast service as well as an HDTV broadcast service. Thus, the demand for a DVB-S2-based digital satellite broadcast service is increasing.

However, in the case of satellite communications, the providing of a service may be interrupted in an NLOS (Non-Line-of-Sight) area such as a tunnel or the downtown area of a city where many skyscrapers are crowded together, so the development of a broadband satellite communications technique suitable for high speed movement and propagation blocking environments is required.

Thus, in order to overcome the high speed movement and propagation blocking environments and provide a reliable and stable service, the DVB-S2-based digital satellite broadcasting system adopts the MPE-FEC scheme defined in DVB-H.

However, the error evaluation polynomial calculation performed for an error correction in an RS decoder of the MPE-FEC increases hardware complexity and degrades calculation speed.

SUMMARY OF THE INVENTION

An aspect of the present invention provides an MPE-FEC (MultiProtocol Encapsulation-Forward Error Correction) RS (Reed-Solomon) decoder and a decoding method thereof capable of reducing the calculation of an error position polynomial of an RS decoder in consideration of hardware complexity and a data processing rate of a reception terminal in the case of applying an MPE-FEC scheme to a DVB-S2 standard system.

According to an aspect of the present invention, there is provided an MPE-FEC (MultiProtocol Encapsulation-Forward Error Correction) RS (Reed-Solomon) decoder including: a syndrome calculation unit calculating a syndrome by using a reception signal in which a value corresponding to an erasure error position has been substituted with 0; an erasure position polynomial calculation unit calculating an erasure position polynomial by using received erasure information; a syndrome calculation unit calculating a modified syndrome by using the syndrome and the erasure position polynomial; a modified Forney's algorithm and chain algorithm performing unit calculating an erasure error size polynomial by using the modified syndrome, calculating an error position based on the chain algorithm by using the erasure position polynomial, and calculating an error size by using a modified Forney's algorithm; and an error correction unit correcting an error through the error position and the error size.

The modified Forney's algorithm may be obtained by multiplying an erasure error position value to Forney's algorithm.

A decoding method of an MPE-FEC (MultiProtocol Encapsulation-Forward Error Correction) RS (Reed-Solomon) decoder, including: substituting a value corresponding to an erasure error position with 0 in a reception signal; calculating a syndrome by using the reception signal; calculating an erasure position polynomial by using erasure information; calculating a modified syndrome by using the syndrome and the erasure position polynomial; calculating an erasure error size polynomial by using the modified syndrome; calculating an error position by using the erasure position polynomial; calculating an error size by using a modified Forney's algorithm; and correcting an error through the error position and the error size.

The modified Forney's algorithm may be obtained by multiplying an erasure error position value to Forney's algorithm.

In calculating the erasure error size polynomial, the erasure error size polynomial may be calculated by the equation shown below:

$\Xi(x)=\Gamma(x)S(x)$, where $\Xi(x)$ is the erasure error size polynomial, $\Gamma(x)$ is the modified syndrome, and $S(x)$ is the syndrome.

In calculating the erasure position, the erasure position may be calculated by the equation shown below:

$Y_k=\Gamma(x)$, where $Y_k$ is the erasure position.

In calculating the erasure size, the erasure size may be calculated by the equation shown below:

$$\upsilon_k = \frac{Y_k \Xi(Y^{-1})}{\Gamma'(Y_k^{-1})},$$

where $\upsilon_k$ is the erasure size.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
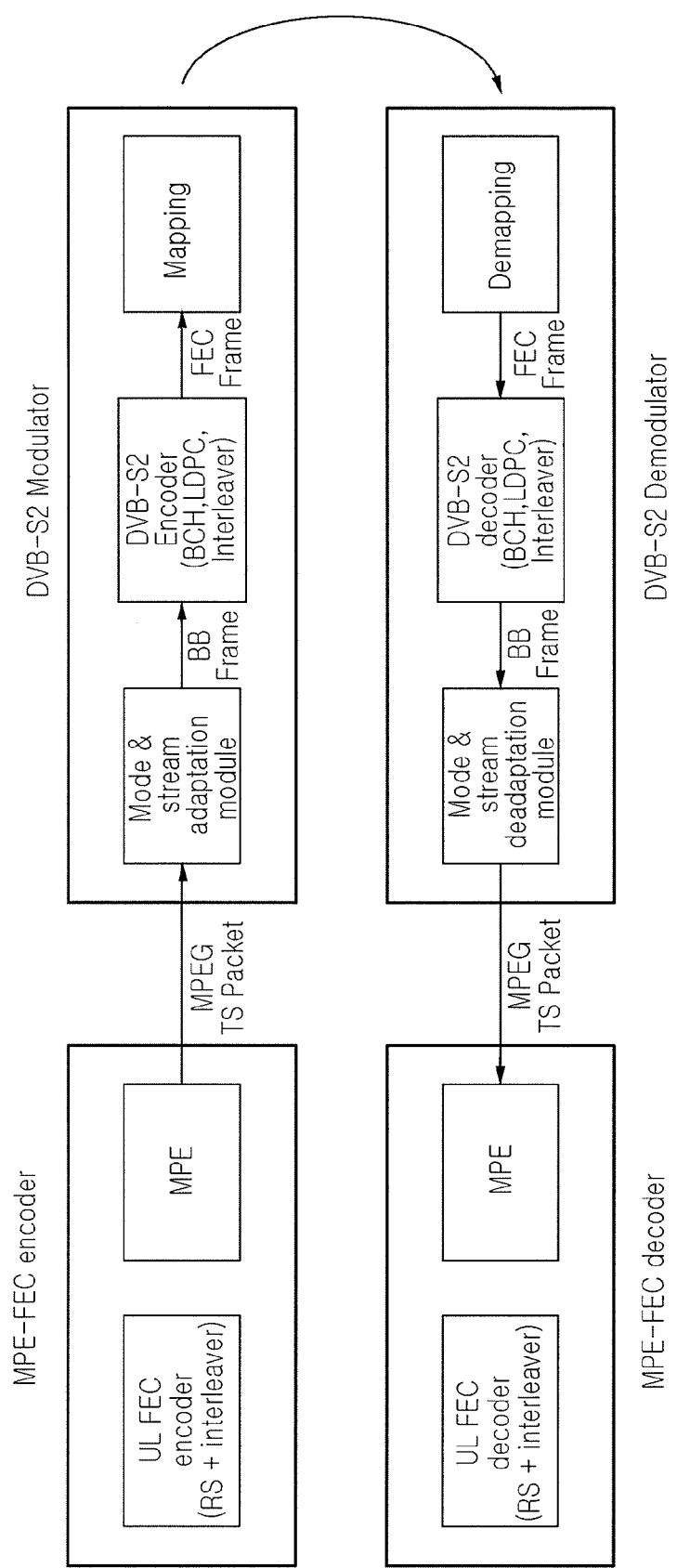
FIG. 1 is a schematic block diagram of a satellite broadcasting system in case where an MPE-FEC (MultiProtocol Encapsulation-Forward Error Correction) scheme is applied to a DVB-S2 standard system.

Exemplary embodiments of the present invention will now be described in detail with reference to the accompanying drawings. The invention may however be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Prior to describing an MPE-FEC (MultiProtocol Encapsulation-Forward Error Correction) RS (Reed-Solomon) decoder and a decoding method thereof according to an exemplary embodiment of the present invention, the structure of a DVB-S2 standard system employing an MPE-FEC scheme and a decoding method of the related art MPE-FEC RS decoder will now be explained.

FIG. 1 is a schematic block diagram of a satellite broadcasting system in a case where the MPE-FEC scheme is applied to the DVB-S2 standard system. The decoding process of the MPE-FEC RS decoder according to an exemplary embodiment of the present invention is performed by a UL FEC decoder of the MPE-FEC decoder illustrated in FIG. 1.

Figure 2:
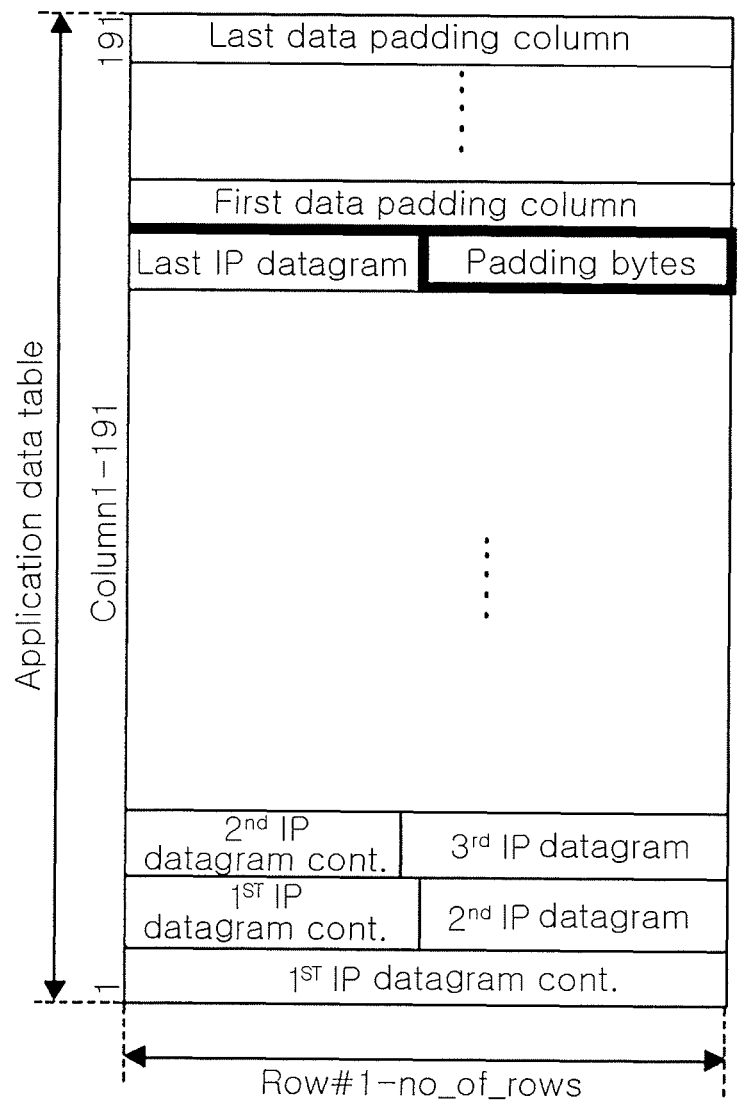
FIG. 2 illustrates the structure of an application data table.
Figure 3:
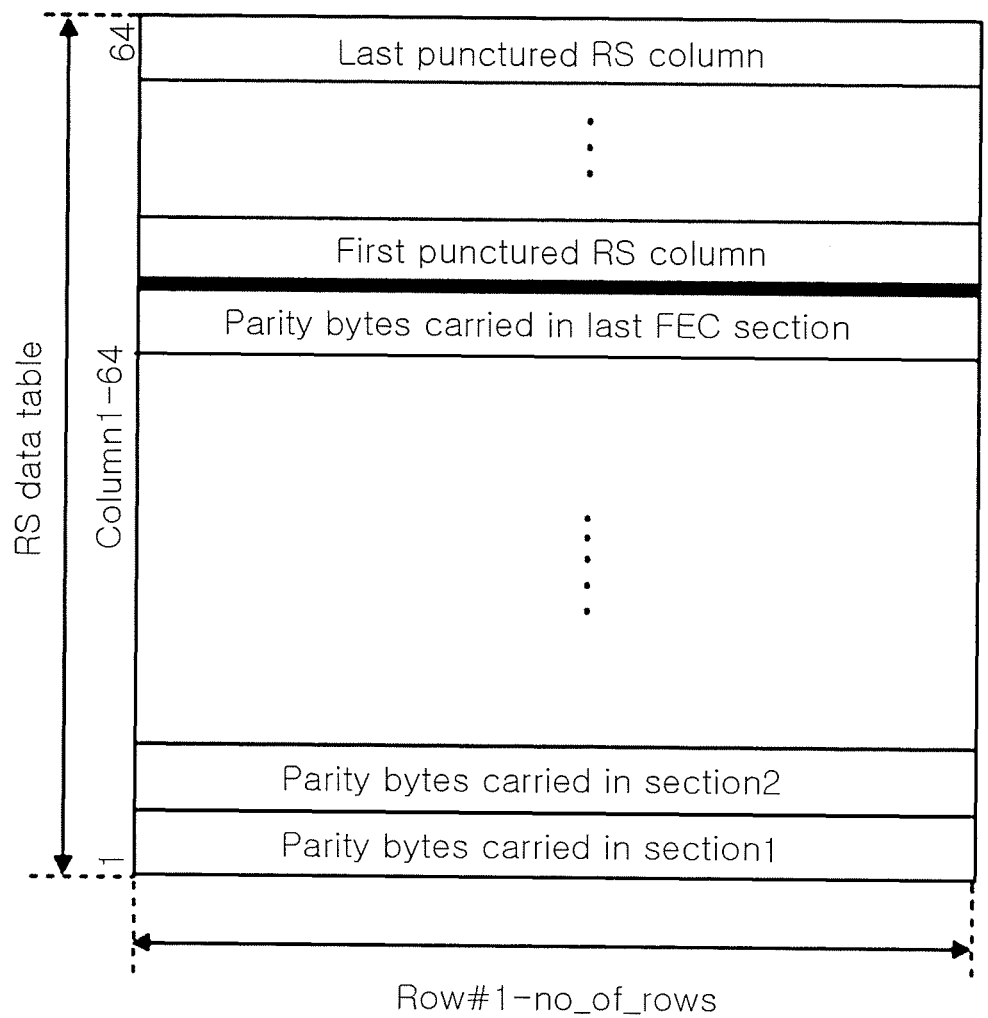
FIG. 3 illustrates the structure of an RS data table.

An IP datagram inputted to the satellite broadcasting system illustrated in FIG. 1 is stored by up to a maximum 191× 1024 bytes in an application data table having the structure as shown in FIG. 2. Thereafter, the stored data is coded by a UL FEC encoder of an MPE-FEC encoder illustrated in FIG. 1 to generate an RS data table having the structure as shown in FIG. 3. A frame configured by the application data table and the RS data table will be defined as a MPE-FEC frame. Subsequently, the data made up of the IP datagram and the FEC section is encapsulated, packetized as an MPEG-TS, inputted to a DVB-S2 modulator, and then transmitted to a satellite.

Figure 4:
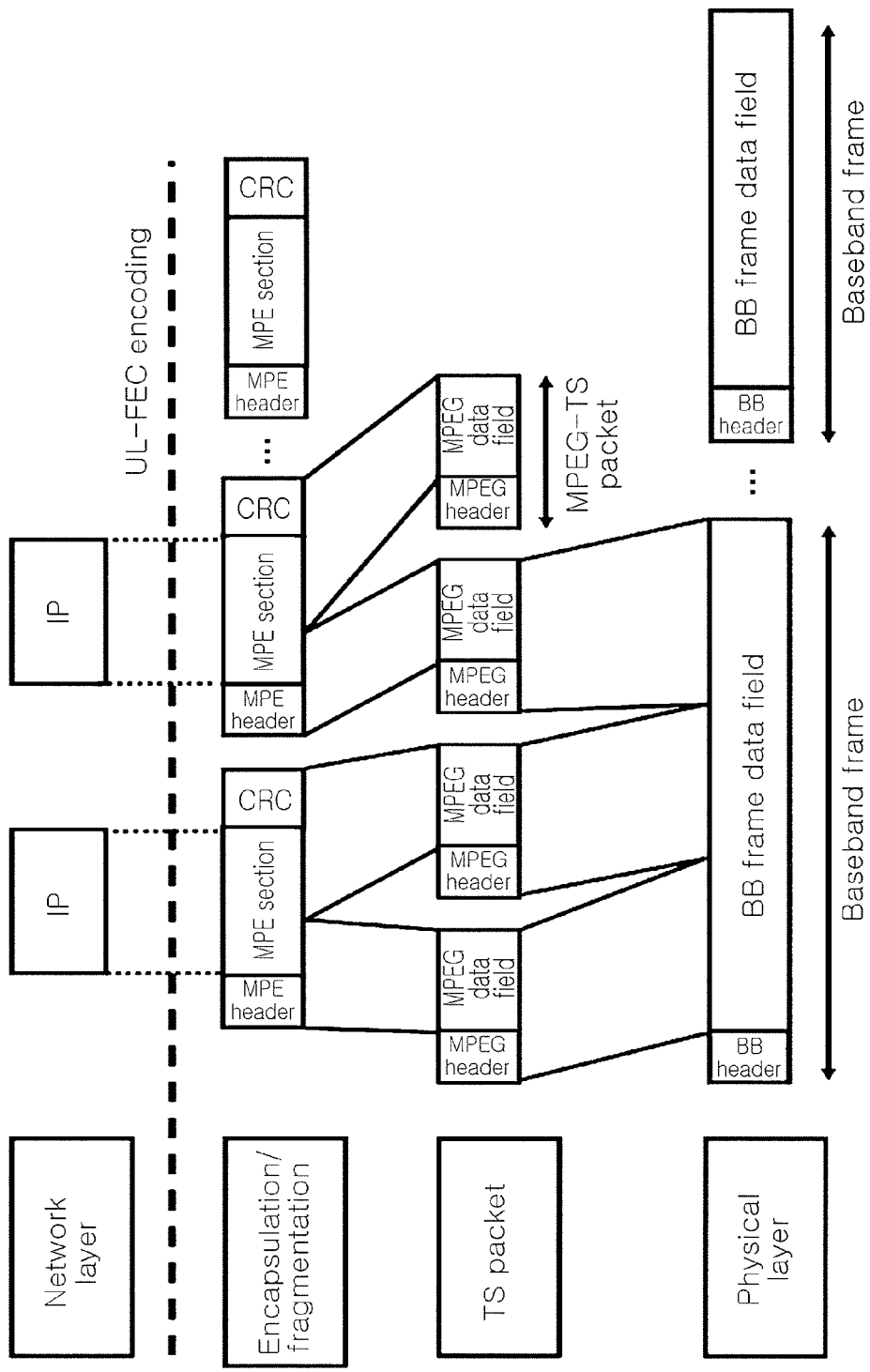
FIG. 4 illustrates an example of multiprotocol encapsulation.

Meanwhile, a signal received by a DVB-S2 demodulator is transmitted to the MPE-FEC decoder so as to be outputted as IP data. FIG. 4 illustrates an example of multiprotocol encapsulation. The MPE-FEC decoder receives erasure information regarding data within an RS frame by using a CRC of an internal MPE-CRC or a mode deadaptation module of a DVB-S2 modulator, and performs an erasure RS decoder calculation.

A general RS decoder performs a decoding calculation through the following process:

1) A value corresponding to an erasure error position in a reception signal is substituted with 0.
2) A syndrome is calculated by using the reception signal.
3) An erasure position polynomial is calculated by using the erasure information.
4) A modified syndrome is calculated by using the erasure position polynomial and the syndrome.
5) An error evaluation polynomial is calculated by using the modified syndrome (based on the Modified Euclidean method).
6) An erasure error size polynomial is calculated by using the modified syndrome and the error evaluation polynomial.
7) An error position is calculated by using the erasure position polynomial and the error evaluation polynomial (according to a chain search).
8) An error size is calculated by using a Forney's algorithm.
9) An error is corrected through the calculated error position and the error size.

An erasure RS code is represented as (n,k), where n is the length of a codeword, and k is the length of input information bits. In this case, correction capability of the erasure RS code is represented by Equation 1 shown below, where e is the number of errors and v is the number of erasure errors.

$$2 \times e + v \leq n - k \quad \text{[Equation 1]}$$

Once the DVB-S2 demodulator corrects an error, an error which has not been corrected appears as an erasure error in the CRC unit of the mode deadaptation module, so only the erasure error exists and e is 0.

Thus, in an exemplary embodiment of the present invention, the RS decoder is designed to consider only the erasure error, thus reducing the hardware size and enhancing the data processing speed.

Figure 5:
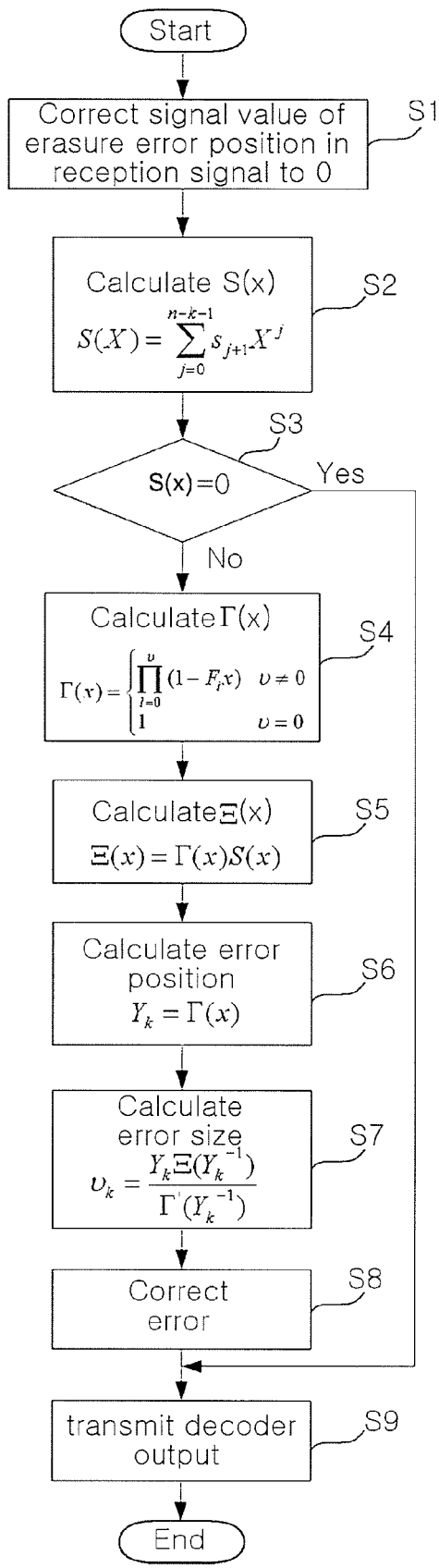
FIG. 5 is a flow chart illustrating a decoding process of an MPE-FEC (MultiProtocol Encapsulation-Forward Error Correction) RS (Reed-Solomon) decoder according to an exemplary embodiment of the present invention.

FIG. 5 is a flow chart illustrating a decoding process of an MPE-FEC (MultiProtocol Encapsulation-Forward Error Correction) RS (Reed-Solomon) decoder according to an exemplary embodiment of the present invention. In an exemplary embodiment of the present invention, omitting such an error evaluation polynomial calculation with high complexity as in the decoding calculation of the related art RS decoder, the size and position of the erasure error are calculated only with the modified syndrome and the erasure error position polynomial, and an error is then corrected. Its detailed process is as follows.

1) A value corresponding to an erasure error position in a reception signal is substituted with 0 (S1).
2) A syndrome is calculated by using the reception signal (S2).
3) An erasure position polynomial is calculated by using the erasure information (S3).
4) A modified syndrome is calculated by using the erasure position polynomial and the syndrome (S4).
5) An error size polynomial is calculated by using the modified syndrome (S5).
6) An error position is calculated by using the erasure position polynomial (according to the chain algorithm) (S6).
7) An error size is calculated by using a modified Forney's algorithm (Here, the modified Forney's algorithm is obtained by multiplying the erasure error position value to the Forney's algorithm) (S7).
8) An error is corrected through the calculated error position and the error size (S8).

In the decoding process according to the exemplary embodiment of the present invention, the steps S1 to S4 are the same as those of the related art decoding process. However, according to the exemplary embodiment of the present invention, the error size is calculated by using the modified Forney's algorithm, rather than calculating the error evaluation polynomial. As a result, because the complicated error evaluation polynomial calculation is omitted, hardware complexity can be reduced, and because the calculation steps in the decoding process are reduced, the data processing rate can be increased.

Figure 6:
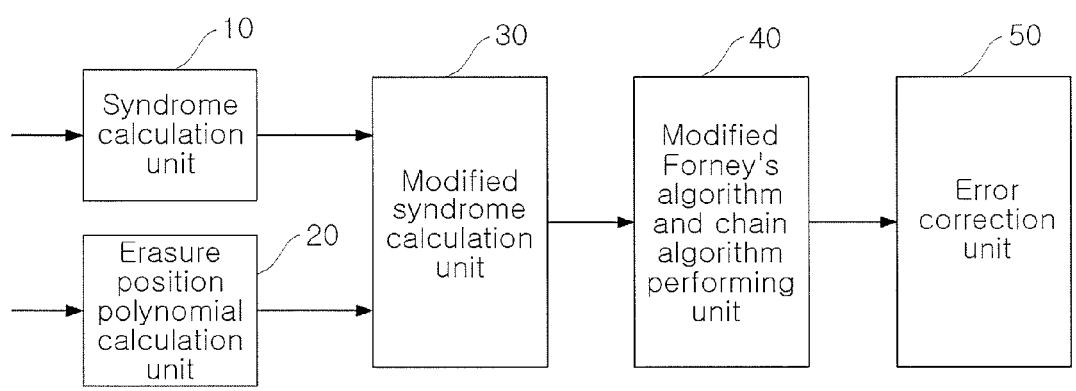
FIG. 6 is a schematic block diagram of the MPE-FEC RS decoder according to an exemplary embodiment of the present invention.

FIG. 6 is a schematic block diagram of the MPE-FEC RS decoder according to an exemplary embodiment of the present invention.

First, a syndrome calculation unit 10 calculates a syndrome by using a reception signal in which a value corresponding to an erasure error position is substituted with 0 (which corresponds to the step S2 of the decoding process), and an erasure position polynomial calculation unit 20 calculates an erasure position polynomial by using received erasure information (which corresponds to the step S3 of the decoding process).

A modified syndrome calculation unit 30 calculates a modified syndrome by using the syndrome and the erasure position polynomial calculated by the syndrome calculation unit 10 and the erasure position polynomial calculation unit 20, respectively (which corresponds to the step S4 of the decoding process).

A modified Forney's algorithm and chain algorithm performing unit 40 calculates an erasure error size polynomial by using the modified syndrome, calculates an error position according to the chain algorithm by using the erasure position polynomial, and calculates an error size by using the modified Forney's algorithm (which corresponds to steps S5 to S7 of the decoding process).

Finally, an error correction unit 50 corrects an error through the calculated error position and the error size (which corresponds to step S8 of the decoding process).

As set forth above, according to exemplary embodiments of the invention, because the RS decoder omits the calculation of an error evaluation polynomial, the RS decoder can implement a high speed operation. In addition, because there is no need to multiply the error evaluation polynomial to the error position polynomial and to the error size polynomial, the hardware complexity of the reception terminal including the RS decoder can be significantly reduced.

While the present invention has been shown and described in connection with the exemplary embodiments, it will be apparent to those skilled in the art that modifications and variations can be made without departing from the spirit and scope of the invention as defined by the appended claims.

What is claimed is:

1. A decoding method of an MPE-FEC (MultiProtocol Encapsulation-Forward Error Correction) RS (Reed-Solomon) decoder, the method comprising:
    substituting a value corresponding to an erasure error position with 0 in a reception signal;
    calculating a syndrome by using the reception signal;
    calculating an erasure position polynomial by using erasure information;
    calculating a modified syndrome by using the syndrome and the erasure position polynomial;
    calculating an erasure error size polynomial by using the modified syndrome;
    calculating an error position by using the erasure position polynomial;
    calculating an error size by using a modified Forney's algorithm; and
    correcting an error through the error position and the error size.

2. The method of claim 1, wherein the modified Forney's algorithm is obtained by multiplying an erasure error position value to Forney's algorithm.

3. The method of claim 1, wherein, in calculating the erasure error size polynomial, the erasure error size polynomial is calculated by the equation shown below:
    $\Xi(x)=\Gamma(x)S(x)$, where $\Xi(x)$ is the erasure error size polynomial, $\Gamma(x)$ is the modified syndrome, and $S(x)$ is the syndrome.

4. The method of claim 3, wherein, in calculating the erasure position, the erasure position is calculated by the equation shown below:
    $Y_k=\Gamma(x)$, where $Y_k$ is the erasure position.

5. The method of claim 4, wherein, in calculating the erasure size, the erasure size is calculated by the equation shown below:

$$v_k = \frac{Y_k \Xi(Y_k^{-1})}{\Gamma'(Y_k^{-1})},$$

where $v_k$ is the erasure size.

6. An MPE-FEC (MultiProtocol Encapsulation-Forward Error Correction) RS (Reed-Solomon) decoder comprising:
    a syndrome calculation unit calculating a syndrome by using a reception signal in which a value corresponding to an erasure error position has been substituted with 0;
    an erasure position polynomial calculation unit calculating an erasure position polynomial by using received erasure information;
    a syndrome calculation unit calculating a modified syndrome by using the syndrome and the erasure position polynomial;
    a modified Forney's algorithm and chain algorithm performing unit calculating an erasure error size polynomial by using the modified syndrome, calculating an error position based on the chain algorithm by using the erasure position polynomial, and calculating an error size by using a modified Forney's algorithm; and
    an error correction unit correcting an error through the error position and the error size.

7. The decoder of claim 6, wherein the modified Forney's algorithm is obtained by multiplying an erasure error position value to Forney's algorithm.

* * * * *